United States Patent
Ishikawa

(10) Patent No.: US 10,504,685 B2
(45) Date of Patent: Dec. 10, 2019

(54) CHARGED PARTICLE BEAM AXIAL ALIGNMENT DEVICE, CHARGED PARTICLE BEAM IRRADIATION DEVICE AND CHARGED PARTICLE BEAM AXIAL ALIGNMENT METHOD

(71) Applicant: Shimadzu Corporation, Kyoto (JP)

(72) Inventor: Takehiro Ishikawa, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 16/243,174

(22) Filed: Jan. 9, 2019

(65) Prior Publication Data
US 2019/0295807 A1    Sep. 26, 2019

(30) Foreign Application Priority Data
Mar. 26, 2018  (JP) ................. 2018-058282

(51) Int. Cl.
| | | |
|---|---|---|
| *H01J 37/14* | (2006.01) | |
| *H01J 37/147* | (2006.01) | |
| *H01J 37/22* | (2006.01) | |

(52) U.S. Cl.
CPC .......... *H01J 37/14* (2013.01); *H01J 37/1471* (2013.01); *H01J 37/1475* (2013.01);
(Continued)

(58) Field of Classification Search
CPC .... H01J 37/14; H01J 37/1471; H01J 37/1475; H01J 37/222; H01J 2237/141;
(Continued)

(56) References Cited

U.S. PATENT DOCUMENTS

2005/0006598 A1 * 1/2005 Pearl ................... H01J 37/1471
                                                         250/492.1
2007/0284542 A1  12/2007 Ogashiwa et al.
(Continued)

FOREIGN PATENT DOCUMENTS

JP    2011-054426 A    3/2011

OTHER PUBLICATIONS

Extended European search report dated Sep. 4, 2019, in corresponding European patent application No. 19164477.2; 8 pages.

*Primary Examiner* — David E Smith
(74) *Attorney, Agent, or Firm* — Maier & Maier, PLLC

(57) ABSTRACT

Magnetic field strength of a converging lens is repeatedly and alternately changed between first strength and second strength. The information about a first aperture image in the case where the magnetic field strength is the first strength and the information about a second aperture image in the case where the magnetic field strength is the second strength are produced. A first movement instruction for the first and second aperture images is given based on the first information and the second information during repetitive changes of the magnetic field strength. Based on the first movement instruction, a first deflector is controlled. A second movement instruction for the first and second aperture images is given based on the first information and the second information during repetitive changes of the magnetic field strength. Based on the second movement instruction, a second deflector is controlled.

13 Claims, 7 Drawing Sheets

(52) U.S. Cl.
CPC ....... *H01J 37/222* (2013.01); *H01J 2237/141* (2013.01); *H01J 2237/1501* (2013.01); *H01J 2237/152* (2013.01); *H01J 2237/24578* (2013.01)

(58) Field of Classification Search
CPC ......... H01J 2237/152; H01J 2237/1501; H01J 2237/24578
See application file for complete search history.

(56) References Cited

U.S. PATENT DOCUMENTS

2008/0073583 A1\* 3/2008 Jasinski ................ H01J 37/304
250/492.21
2008/0078943 A1\* 4/2008 Kawai ................. H01J 37/1471
250/397

\* cited by examiner

CHARGED PARTICLE BEAM AXIAL ALIGNMENT DEVICE, CHARGED PARTICLE BEAM IRRADIATION DEVICE AND CHARGED PARTICLE BEAM AXIAL ALIGNMENT METHOD

FIELD

The present invention relates to a charged particle beam axial alignment device, a charged particle beam irradiation device and a charged particle beam axial alignment method for aligning an axis of a charged particle beam.

BACKGROUND

A charged particle beam irradiation device has been known as a device for analysis or observation of a sample with high resolution. For example, in JP 2011-54426 A, an electron beam irradiation device that includes an electron gun, an inlet beam deflector, a converging lens system having two-tiered condenser lenses, an outlet beam deflector, an objective aperture plate, a scanning coil and an objective lens is described.

In the electron beam irradiation device, an electron beam emitted from the electron gun passes through the converging lens system to be converged. Then, the electron beam passes through the objective aperture plate, so that a beam diameter is restricted. Thereafter, the electron beam passes through scanning coils and is scanned in a plane, and the diameter of the electron beam is reduced to a small diameter when the electron beam passes through the objective lens. Then, a sample is irradiated with the electron beam. Secondary electrons, characteristic X-rays or the like are released from the sample irradiated with the electron beam and detected, whereby the sample is observed or analyzed.

The inlet beam deflector is used to align an axis of the electron beam such that the electron beam passes through the center of each condenser lens of the converging lens system. The outlet beam deflector is used to align the axis of the electron beam such that the electron beam passes through the center of the objective lens.

SUMMARY

In the axial alignment of the electron beam described in JP 2011-54426 A, in the case where a focal point of one condenser lens is fixed and focal points of another condenser lens are located at two different positions, when the electron beam is scanned by the outlet beam deflector, two scanned images are respectively formed. In each scanned image, an aperture image indicating an opening of the objective aperture plate appears. A deviation between the positions of the two aperture images reflects the deviation between the centers of the two condenser lenses and an axis of the optical beam. As such, the image in which the two aperture images are superimposed is created and displayed in the display unit. At least one aperture image is a still image that is played by software or a mark that indicates its location and is played by software.

A user adjusts the inlet beam deflector such that the other aperture image overlaps with the one aperture image, and then adjusts the outlet beam deflector such that the other aperture image is located at the center of the image. Here, depending on the configuration of the electron beam irradiation device, two adjustments interfere with each other, and it may be necessary to repeat the above-mentioned adjustment. In this case, the user is to repeat an operation of creating and updating the image in which the two aperture images overlap with each other, an operation of adjusting the inlet beam deflector and an operation of adjusting the outlet beam deflector. Therefore, the axial alignment of the electron beam is cumbersome, and development of the electron beam irradiation device with which the axial alignment can be easily performed is desired.

An object of the present invention is to provide a charged particle beam axial alignment device, a charged particle beam irradiation device and a charged particle beam axial alignment method for enabling an axis of a charged particle beam to be easily aligned.

(1) A charged particle beam axial alignment device according to one aspect of the present invention that adjusts an axis of a charged particle beam in a charged particle beam irradiation device for irradiating a subject surface with a charged particle beam through a first deflector, a converging lens, a second deflector and an objective aperture plate, includes a strength changer that repeatedly and alternately changes magnetic field strength of the converging lens between first strength and second strength, a producer that produces first information corresponding to a position of a first aperture image indicating an opening of the objective aperture plate when the magnetic field strength is the first strength, and produces second information corresponding to a position of a second aperture image indicating the opening of the objective aperture plate when the magnetic field strength is the second strength, a first movement instructor that gives a first movement instruction for the first and second aperture images during repetitive changes of the magnetic field strength based on the first information and the second information, a first deflection controller that controls the first deflector to move the first and second aperture images based on the first movement instruction, a second movement instructor that gives a second movement instruction for the first and second aperture images based on the first information and the second information during repetitive changes of the magnetic field strength, and a second deflection controller that controls the second deflector to move the first and second aperture images based on the second movement instruction.

In this charged particle beam axial alignment device, the magnetic field strength of the converging lens is alternately and repeatedly changed between the first strength and the second strength. The first information corresponding to the position of the first aperture image showing the opening of the objective aperture plate when the magnetic field strength is the first strength is produced, and the second information corresponding to the position of the second aperture image showing the opening of the objective aperture plate when the magnetic field strength is the second strength is produced.

The first movement instruction is given based on the first information and the second information during the repetitive changes of the magnetic field strength. Based on the first movement instruction, the first deflector is controlled to move the first and second aperture images. Further, the second movement instruction is given based on the first information and the second information during the repetitive changes of the magnetic field strength. Based on the second movement instruction, the second deflector is controlled to move the first and second aperture images based on the second movement instruction.

With the above-mentioned configuration, the magnetic field strength is repeatedly and alternately changed between the first strength and the second strength, so that it is not necessary for the user to switch the strength each time and perform the operation of producing the first information and the second information. Therefore, the operational burden of the user is alleviated. As a result, the axis of the charged particle beam is easily aligned.

(2) The charged particle beam axial alignment device may further include a display controller that allows a display unit to display the first aperture image based on the first information as an image, and allows the display unit to display the second aperture image based on the second information as an image, wherein the first movement instructor may accept an operation for adjusting a deflection direction and a deflection amount of the charged particle beam by the first deflector from a first operator, and may give the first movement instruction based on the accepted operation, the second movement instructor may accept an operation for adjusting a deflection direction and a deflection amount of the charged particle beam by the second deflector from a second operator, and may give the second movement instruction based on the accepted operation, the producer may update the first information and the second information according to movement of the first and second aperture images, and the display controller may update images of the first and second aperture images displayed in the display unit based on the updated first information and the updated second information.

In this case, the first and second aperture images in the image displayed in the display unit are moved according to the adjustment carried out by the first and second deflectors. Therefore, the user can adjust the deflection direction and the deflection amount of the charged particle beam by the first and second deflectors while viewing the first and second aperture images in the image. Further, it is possible to easily and quickly switch the adjustment between the adjustment to be carried out by the first deflector and the adjustment to be carried out by the second deflector by properly operating the first operator and the second operator. Thus, the operability of the charged particle beam axial alignment device is improved. As a result, the axis of the charged particle beam can be aligned easily in a short period of time.

(3) One of the first and second operators may be a first press-down portion of a pointing device, and another one of the first and second operators may be a second press-down portion of the pointing device.

In this case, the user can easily and quickly switch the adjustment between the adjustment to be carried out by the first deflector and the adjustment to be carried out by the second deflector by properly pressing down the first press-down portion and the second press-down portion of the pointing device. Thus, the operability of the charged particle beam axial alignment device is more sufficiently improved. As a result, the axis of the charged particle beam can be more easily aligned.

(4) The strength changer may repeatedly change the magnetic field strength between the first strength and the second strength in a period during which the first and second aperture images in the display unit are simultaneously viewed due to residual image effect. In this case, the user can simultaneously view the first and second aperture images in the image and easily identify the positional relationship between the first and second aperture images. Thus, the axis of the charged particle beam can be more easily aligned.

(5) The first movement instructor may specify movement directions and movement distances of the first and second aperture images for allowing the first aperture image and the second aperture image to overlap with each other based on the first information and the second information, and may give the first movement instruction based on the specified movement directions and the specified movement distances, and the second movement instructor may specify movement directions and movement distances of the first and second aperture images for allowing the first and second aperture images to move to a predetermined position based on the first information and the second information, and may give the second movement instruction based on the specified movement directions and the specified movement distances.

In this case, the first and second deflectors are automatically adjusted such that the first and second aperture images overlap at the predetermined position. Therefore, it is not necessary for the user to perform the operation for adjusting the first and second deflectors. Thus, the axis of the charged particle beam can be more easily aligned.

(6) The first movement instructor may specify movement directions and movement distances for allowing centers of gravity of the first aperture image and the second aperture image to overlap with each other, and the second movement instructor may specify movement directions and movement distances of the first and second aperture images for allowing the centers of gravity of the first and second aperture images to move to the predetermined position. With this configuration, the axis of the charged particle beam can be aligned more accurately than the case where the centers of the first and second aperture images overlap with each other at the predetermined position.

(7) The predetermined position may overlap with an optical axis of the objective lens. In this case, the first and second aperture images overlap with the predetermined position, whereby the axis of the charged particle beam can be aligned with the optical axis of the objective lens.

(8) The converging lens may include first and second condenser lenses, the first strength may be determined as a combination of predetermined magnetic field strength of the first condenser lens and predetermined magnetic field strength of the second condenser lens, and the second strength may be determined as a combination of another predetermined magnetic field strength of the first condenser lens and another predetermined magnetic field strength of the second condenser lens.

In this case, the electric current of the charged particle beam can be changed over a wide range. Further, the axis of the charged particle beam is aligned with the magnetic field strength of the first condenser lens and the magnetic field strength of the second condenser lens changed in an interlocking manner. Therefore, after the axial alignment, even when the charged particle beam irradiation device is used with the magnetic field strength of the first condenser lens and the magnetic field strength of the second condenser lens changed in an interlocking manner, the desired portion of the sample can be accurately irradiated with the charged particle beam.

(9) The subject surface may be provided at a faraday cup that can measure an electric current of the charged particle beam, and the producer may produce the first information and the second information based on the electric current measured by the faraday cup.

In this case, it is possible to align the axis of the charged particle beam without irradiating the sample with the charged particle beam. Thus, the sample can be prevented from being damaged by the charged particle beam.

(10) One of the first strength and the second strength may be determined such that the electric current of the charged particle beam measured by the faraday cup is maximized. With this configuration, the axis of the charged particle beam is aligned with the electric current of the charged particle beam maximized. Therefore, after the axial alignment, even when the charged particle beam irradiation device is used with the electric current of the charged particle beam maximized, the desired portion of the sample can be accurately irradiated with the charged particle beam.

(11) The faraday cup may be configured to measure the electric current of the charged particle beam using a plurality of measurable ranges for the electric current, and the first strength and the second strength may be determined such that the electric currents to be measured by the faraday cup are included in a same measurable range. With this configuration, even when the magnetic field strength is changed, generation of data indicating blown out highlights and blocked up shadows in the first information and the second information can be prevented even when the magnetic field strength is changed. Thus, the first and second aperture images can be accurately aligned.

(12) A charged particle beam irradiation device according to another aspect of the present invention includes a charged particle source that produces a charged particle beam, a converging lens that converges the charged particle beam, which is produced by the charged particle source, by a magnetic field, a first deflector that adjusts a positional relationship between an axis of the charged particle beam and an optical axis of the converging lens by deflecting the charged particle beam produced by the charged particle source, an objective aperture plate that restricts an electric current of the charged particle beam converged by the converging lens, a second deflector that adjusts a positional relationship of the charged particle beam on a subject surface by deflecting the charged particle beam converged by the converging lens, and a charged particle beam axial alignment device that adjusts the axis of the charged particle beam, wherein the charged particle beam axial alignment device includes a strength changer that alternately and repeatedly changes magnetic field strength of the converging lens between first strength and second strength, a producer that produces first information corresponding to a position of a first aperture image indicating an opening of the objective aperture plate when the magnetic field strength is the first strength, and produces second information corresponding to a position of a second aperture image indicating the opening of the objective aperture plate when the magnetic field strength is the second strength, a first movement instructor that gives a first movement instruction of the first and second aperture images based on the first information and the second information during repetitive changes between the first strength and the second strength by the strength changer, a first deflection controller that controls the first deflector to move the first and second aperture images based on the first movement instruction, a second movement instructor that gives a second movement instruction of the first and second aperture images based on the first information and the second information during repetitive changes between the first strength and the second strength by the strength changer, and a second deflection controller that controls the second deflector to move the first and second aperture images based on the second movement instruction.

In this charged particle beam irradiation device, the charged particle beam produced by the charged particle source is converged by the magnetic field of the converging lens and emitted to the subject surface. The charged particle beam produced by the charged particle source is deflected by the first deflector, whereby the positional relationship between the axis of the charged particle beam and the optical axis of the converging lens is adjusted. The electric current of the charged particle beam converged by the converging lens is restricted by the objective aperture plate. The charged particle beam converged by the converging lens is deflected by the second deflector, whereby the positional relationship of the charged particle beam on the subject surface is adjusted. The axis of the charged particle beam is adjusted by the charged particle beam axial alignment device.

In the charged particle beam axial alignment device, the magnetic field strength is alternately and repeatedly changed between the first strength and the second strength, whereby it is not necessary for the user to switch the strength each time and perform the operation for producing the first information and the second information. Therefore, the operational burden of the user is alleviated. As a result, the axis of the charged particle beam can be easily aligned.

(13) A charged particle beam axial alignment method according to yet another aspect of the present invention for adjusting an axis of a charged particle beam in a charged particle beam irradiation device that irradiates an subject surface with a charged particle beam through a first deflector, a converging lens, a second deflector and an objective aperture plate, includes changing magnetic field strength of the converging lens between first strength and second strength, producing first information corresponding to a position of a first aperture image indicating an opening of the objective aperture plate when the magnetic field strength is the first strength, and producing second information corresponding to a position of a second aperture image indicating the opening of the objective aperture plate when the magnetic field strength is the second strength, giving a first movement instruction of the first and second aperture images based on the first information and the second information during repetitive changes of the magnetic field strength, controlling the first deflector to move the first and second aperture images based on the first movement instruction, giving a second movement instruction of the first and second aperture images based on the first information and the second information during repetitive changes of the magnetic field strength, and controlling the second deflector to move the first and second aperture images based on the second movement instruction.

With this charged particle beam axial alignment method, the magnetic field strength is alternately and repeatedly changed between the first strength and the second strength, whereby it is not necessary for the user to switch the strength each time and perform the operation for producing the first information and the second information. Therefore, the operational burden of the user is alleviated. As a result, the axis of the charged particle beam is easily aligned.

Other features, elements, features, and advantages of the present invention will become more apparent from the following description of preferred embodiments of the present invention with reference to the attached drawings.

DETAILED DESCRIPTION

[1] First Embodiment

A charged particle beam axial alignment device (hereinafter abbreviated as an axial alignment device), a charged particle beam irradiation device including the axial alignment device and a charged particle beam axial alignment method according to a first embodiment of the present invention will be described below in detail with reference to drawings. In the present embodiment, the charged particle beam irradiation device is an electron beam irradiation device for an EPMA (Electron Probe Micro Analyzer).

(1) Configuration of Charged Particle Beam Irradiation Device

Figure 1:
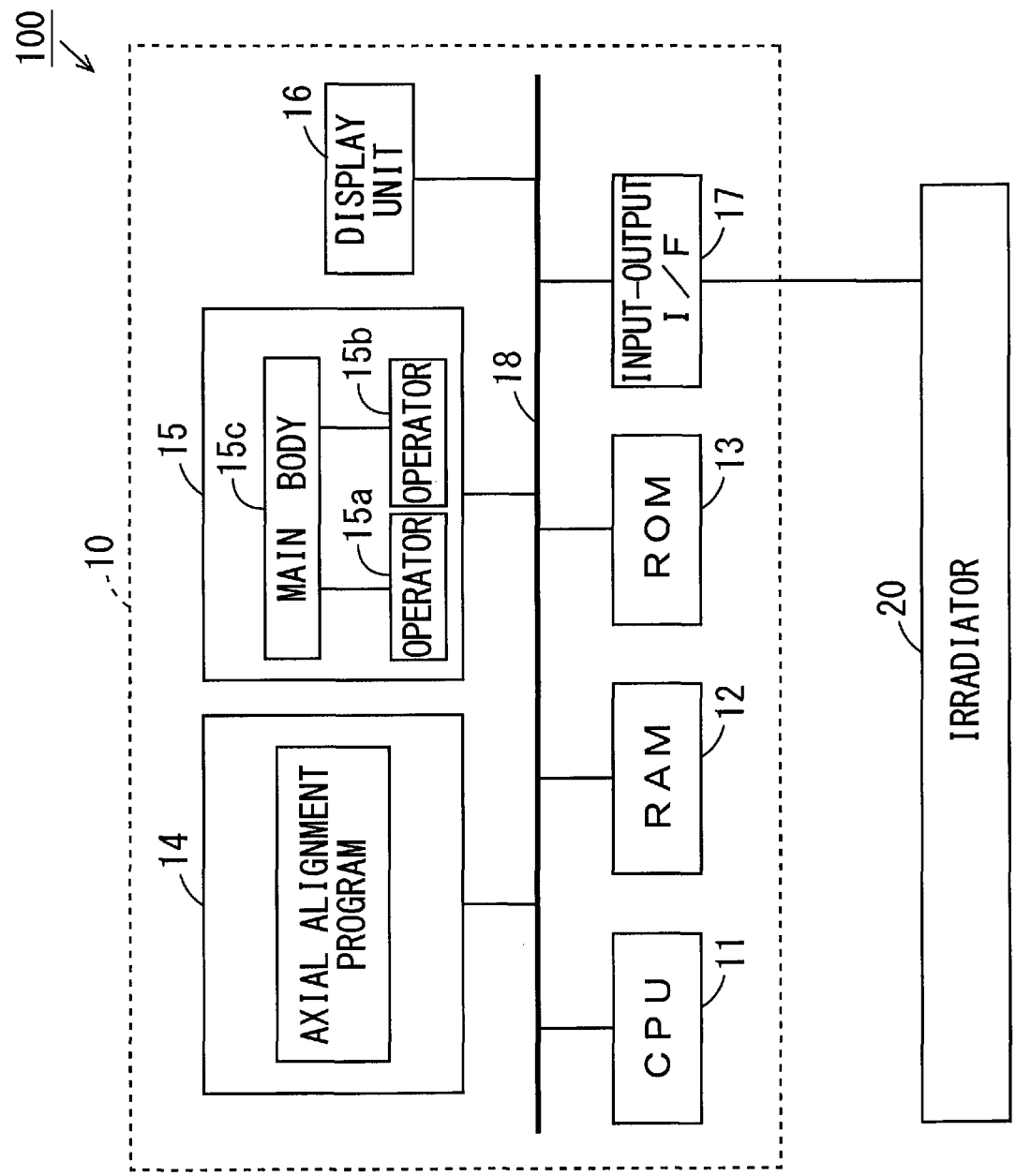
FIG. 1 is a diagram showing a configuration of a charged particle beam irradiation device according to a first embodiment.

FIG. 1 is a diagram showing a configuration of the charged particle beam irradiation device according to the first embodiment. In FIG. 1, the configuration of hardware of the charged particle beam irradiation device 100 is mainly shown. As shown in FIG. 1, the charged particle beam irradiation device 100 includes a processer 10 and an irradiator 20.

The processor 10 is constituted by a CPU (Central Processing Unit) 11, a RAM (Random Access Memory) 12, a ROM (Read On Memory) 13, a storage 14, an operation unit 15, a display unit 16, and an input-output I/F (interface) 17. The CPU 11, the RAM 12, the ROM 13, the storage 14, the operation unit 15, the display unit 16 and the input-output I/F 17 are connected to a bus 18.

The RAM 12 is used as a work area for the CPU 11. A system program is stored in the ROM 13. The storage 14 includes a storage medium such as a hard disc or a semiconductor memory and stores an axial alignment program. The CPU 11 executes the axial alignment program stored in the storage 14 on the RAM 12, whereby an axial alignment process, described below, is performed.

The operation unit 15 is a touch panel, a keyboard or a pointing device and includes operators 15a, 15b. A mouse, a joystick or the like is used as the pointing device. In the present embodiment, the operation unit 15 is a mouse and further includes a main body 15c. In this case, a right press-down portion and a left press-down portion of the mouse are the operators 15a, 15b, respectively, and the main body of the mouse is the main body 15c. A user can give various instructions to the below-mentioned axial alignment device using the operation unit 15. The display unit 16 can display an image based on the image data produced by the axial alignment device. The display unit 16 is a display device such as a liquid crystal display device. The input-output I/F 17 is connected to an irradiator 20.

Figure 2:
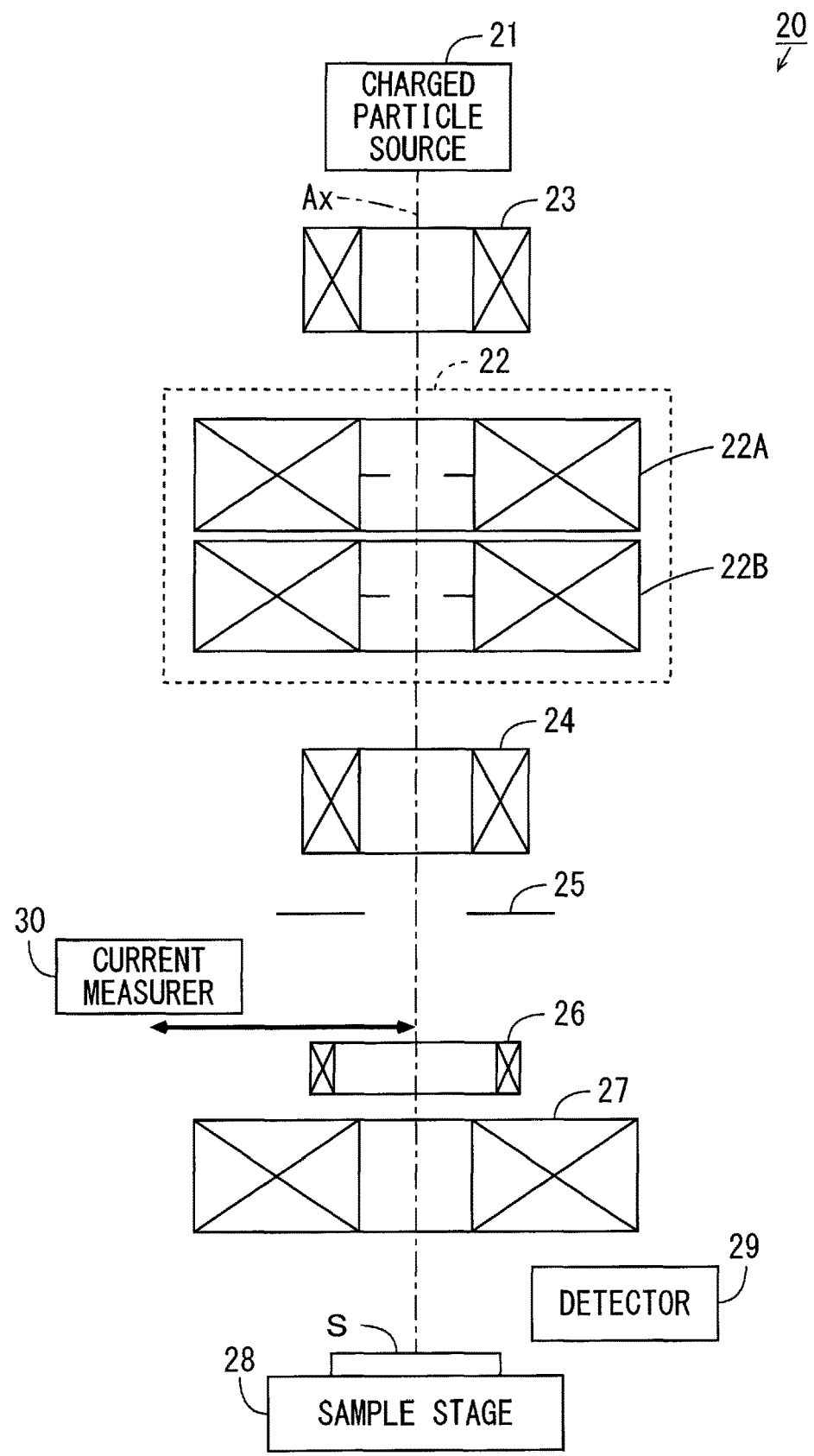
FIG. 2 is a diagram showing a schematic configuration of an irradiator of FIG. 1.

FIG. 2 is a diagram showing a schematic configuration of the irradiator 20 of FIG. 1. As shown in FIG. 2, the irradiator 20 includes a charged particle source 21, a converging lens 22, deflectors 23, 24, an objective aperture plate 25, a scanner 26, an objective lens 27, a sample stage 28, a detector 29 and a current measurer 30. Further, the irradiator 20 further includes a power source (not shown) for driving each of the charged particle source 21, the converging lens 22, the deflectors 23, 24, the scanner 26, the objective lens 27, the detector 29 and the current measurer 30. The operation of the power source is controlled by the processor 10.

The charged particle source 21 is an electron gun, for example, and emits an electron beam to the sample stage 28 as a charged particle beam. The deflector 23, the converging lens 22, the deflector 24, the objective aperture plate 25, the scanner 26 and the objective lens 27 are arranged in this order in an emission direction of the electron beam on an axis Ax connecting the charged particle source 21 to the sample stage 28.

The deflector 23 is constituted by alignment coils, for example, and deflects the electron beam in a plane perpendicular to an optical axis of the deflector 23. The deflector 23 may be constituted by two alignment coils that are arranged in a direction parallel to the axis Ax to be spaced apart from each other. The deflector 23 is adjusted such that the electron beam emitted from the charged particle source 21 passes through the center of each of condenser lenses 22A, 22B, described below.

The converging lens 22 is constituted by the condenser lenses 22A, 22B having a fixed relative positional relationship with each other. Each of the condenser lenses 22A, 22B is adjusted such that the electron beam deflected by the deflector 23 converges at a focal point in front of the objective aperture plate 25.

The deflector 24 has the configuration similar to that of the deflector 23, and is adjusted such that the electron beam converged by the converging lens 22 passes through the center of the objective lens 27. The deflector 24 can two-dimensionally scan the electron beam by the deflection amount during adjustment of the deflector 24. The objective aperture plate 25 transmits the electron beam deflected by the deflector 24, thereby restricting an electric current of the electron beam.

The scanner 26 is constituted by scanning coils, for example, and two-dimensionally scans the electron beam that has passed through the objective aperture plate 25 in a plane perpendicular to an optical axis of the scanner 26. The objective lens 27 is adjusted such that the electron beam scanned by the scanner 26 converges at a predetermined position.

A sample S that is to be analyzed or observed is placed on the sample stage 28. The electron beam that is two-dimensionally scanned by the scanner 26 and converged by the objective lens 27 is emitted to each portion of a surface of the sample S. The detector 29 is constituted by a reflective electron detector or a secondary electron detector, and detects electrons reflected from each portion of the surface of the sample S due to irradiation with the electron beam or electrons (secondary electrons) released from each portion of the surface of the sample S due to irradiation with the electron beam. The scanned image of the sample S is produced by the processor 10 of FIG. 1 based on the electrons detected by the detector 29.

The current measurer 30 includes a faraday cup having a subject surface to be irradiated with the electron beam, and measures a current of the electron beam with which each portion of the subject surface is irradiated. The current measurer 30 is provided with a plurality of measurable ranges for measuring a current. It is possible to measure a minute current to a high current by appropriately switching the measurable ranges.

When the deflectors 23, 24 are adjusted, the current measurer 30 is provided on the axis Ax between the objective aperture plate 25 and the scanner 26 by an actuator (not shown) (indicated by a thick arrow in FIG. 2). As described below, the image data indicating the image is produced based on the current measured by the current measurer 30. The current measurer 30 is arranged such that the center of the image overlaps with the optical axis of the objective lens 27.

In the case where the electron beam has not passed through the center of each of the condenser lenses 22A, 22B, when the focal point of the condenser lens 22A or the focal point of the condenser lens 22B is changed, the position irradiated with the electron beam on the sample S is changed. As such, the axial alignment device for adjusting the deflectors 23, 24 is provided in the charged particle beam irradiation device 100 based on the current measured by the current measurer 30 such that the electron beam passes through the center of each of the condenser lenses 22A, 22B.

(2) Axial Alignment Device

Figure 3:
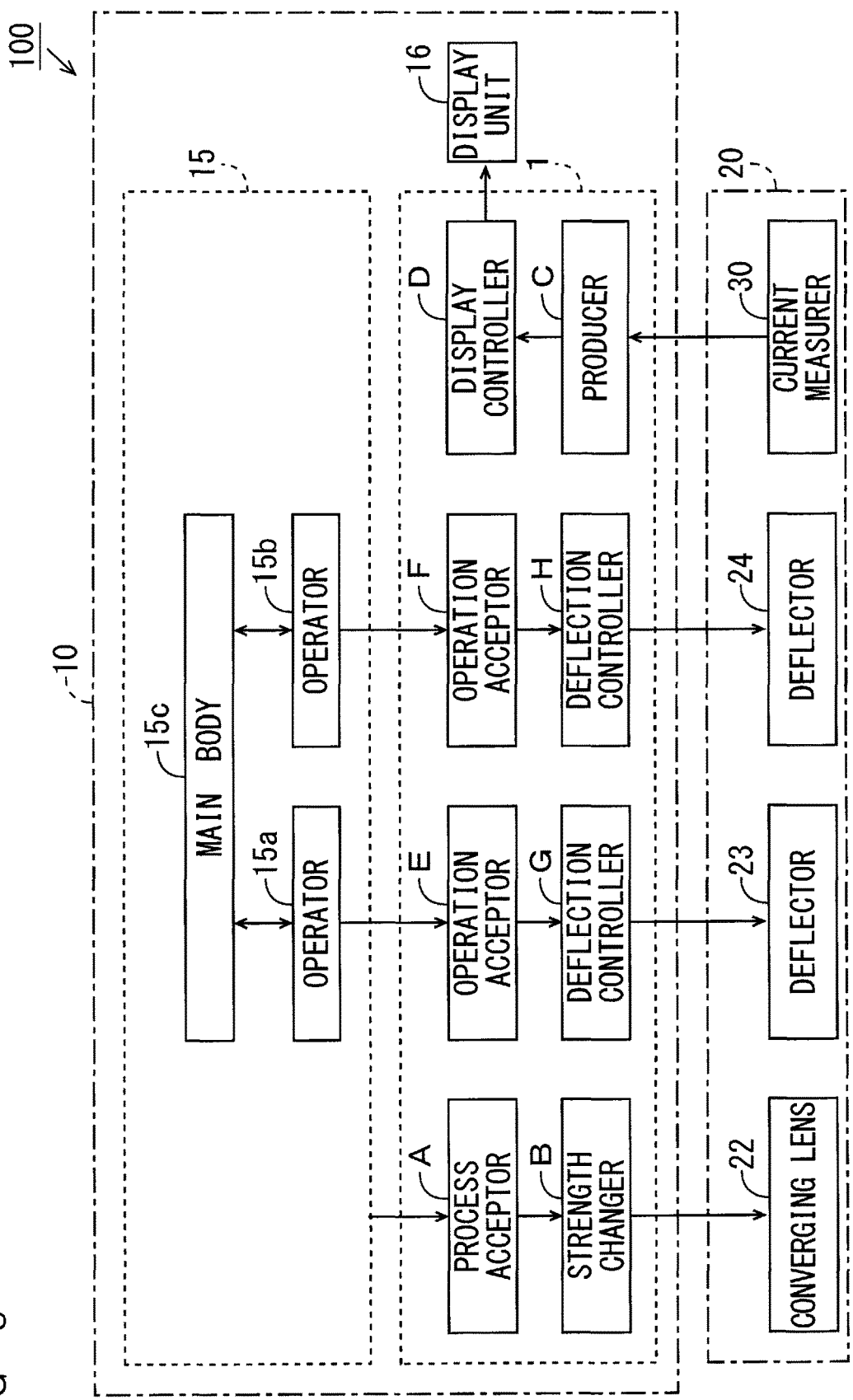
FIG. 3 is a diagram showing a configuration of an axial alignment device included in the charged particle beam irradiation device.

FIG. 3 is a diagram showing a configuration of the axial alignment device 1 included in the charged particle beam irradiation device 100. As shown in FIG. 3, the axial alignment device 1 includes a process acceptor A, a strength changer B, a producer C, a display controller D, operation acceptors E, F and deflection controllers G, H. The CPU 11 of FIG. 1 executes the axial alignment program stored in the storage 14, whereby the functions of the constituent elements (A to H) of the axial alignment device 1 of FIG. 3 are implemented. Part or all of the constituent elements (A to H) of the axial alignment device 1 of FIG. 3 may be implemented by hardware such as an electronic circuit.

The process acceptor A accepts various instructions or designation from the user during the axial alignment process. For example, the process acceptor A accepts designation of the magnetic field strength (hereinafter simply referred to as strength) of the converging lens 22 from the user. The user can designate the first strength and the second strength by operating the operation unit 15. In the present embodiment, the first strength of the converging lens 22 is designated by a combination of predetermined strength of the condenser lens 22A and predetermined strength of the condenser lens 22B. Further, the second strength of the converging lens 22 is designated by a combination of another strength of the condenser lens 22A and another strength of the condenser lens 22B.

Here, accuracy of the axial alignment is required the most when the current of the electron beam is maximized. Therefore, one of the first strength and the second strength is preferably designated such that the current of the electron beam measured by the current measurer 30 is maximized. Further, the other one of the first strength and the second strength is preferably designated as the strength that is set during the actual observation of the sample S. Thus, the deflectors 23, 24 can be adjusted within the range of strength that is set during the actual observation of the sample S. In these cases, a desired portion of the sample S can be accurately irradiated with the electron beam.

Further, the first strength and the second strength are preferably designated such that the current of the electron beam can be measured using the measurable range that is the same as that of the current measurer 30. In this case, generation of blown out highlights and blocked up shadows in the image data produced based on the current measured by the current measurer 30 is prevented. Thus, the axis of the electron beam can be accurately aligned.

The strength changer B sets the first strength and the second strength accepted by the process acceptor A. Further, the strength changer B carries out ramp control of the driving power source of the conversing lens 22 such that the strength of the converging lens 22 repeatedly and alternately is changed between the first strength and the second strength. Thus, the focal point of the converging lens 22 is alternately changed between the focal point corresponding to the first strength and the focal point corresponding to the second strength in a sawtooth-wave shape.

The subject surface of the current measurer 30 is irradiated with the electron beam that has been emitted from the charged particle source 21 and has sequentially passed through the deflector 23, the converging lens 22, the deflector 24 and the objective aperture plate 25. When the electron beam is scanned by the deflector 24 by the deflection amount, the closer the center of the beam is to the opening of the aperture plate 25, the larger the current is. The producer C sequentially produces the image data based on the current measured by the current measurer 30 while allowing the deflector 24 to scan the electron beam. The image data includes the information corresponding to the position of the opening of the objective aperture plate 25 when the strength is the first strength or the information corresponding to the position of the opening of the objective aperture plate 25 when the strength is the second strength.

The display controller D allows the display unit 16 to display the image based on the image data produced by the producer C. In the image displayed in the display unit 16, an aperture image showing openings of the objective aperture plate 25 when the strength is the first strength and an aperture image showing openings of the objective aperture plate 25 when the strength is the second strength repeatedly and alternately appear. In the present embodiment, the strength changer B repeatedly and alternately changes the strength between the first strength and the second strength in a short period of time, so that the two aperture images in the image are simultaneously viewed due to residual image effect.

Here, when the electron beam emitted from the charged particle source 21 has not passed through the center of each of the condenser lenses 22A, 22B, a deviation between the positions of the two aperture images is generated. The user adjusts the deflectors 23, 24 by operating the operation unit 15 while checking the positions of the two aperture images in the image displayed in the display unit 16 such that the centers of the two aperture images overlap with each other. Thus, the axis of the electron beam can be aligned such that the electron beam passes through the center of each of the condenser lenses 22A, 22B.

The operation acceptor E accepts an operation for adjusting the deflection direction and the deflection amount of the electron beam by the deflector 23 from the operator 15a of the operation unit 15, and supplies the accepted operation to the deflection controller G as a movement instruction for the aperture image. The movement direction and the movement amount of the main body 15c that is moved with the operator 15a pressed down respectively correspond to the deflection direction and the deflection amount of the electron beam by the deflector 23. The user moves the main body 15c in a desired direction by a desired distance while pressing down the operator 15a, thereby being able to perform an operation for adjusting the deflection direction and the deflection amount of the electron beam by the deflector 23.

The operation acceptor F accepts an operation for adjusting the deflection direction and the deflection amount of the electron beam by the deflector 24 from the operator 15b of the operation unit 15, and supplies the accepted operation to the deflection controller H as a movement instruction for the aperture image. The movement direction and the movement amount of the main body 15c that is moved with the operator 15b pressed down respectively correspond to the deflection direction and the deflection amount of the electron beam by the deflector 24. The user moves the main body 15c in a desired direction by a desired distance while pressing down the operator 15b, thereby being able to perform an operation for adjusting the deflection direction and the deflection amount of the electron beam by the deflector 24.

The deflection controller G specifies the deflection direction and the deflection amount of the electron beam by the deflector 23 based on the operation accepted by the operation acceptor E, and controls the driving power source of the deflector 23 such that the electron beam is deflected in the specified deflection direction by the specified deflection amount. The deflection controller H specifies the deflection direction and the deflection amount of the electron beam by the deflector 24 based on the operation accepted by the operation acceptor F, and controls the driving power source of the deflector 24 such that the electron beam is deflected in the specified deflection direction by the specified deflection amount.

(3) Axial Alignment Process

Figure 4:
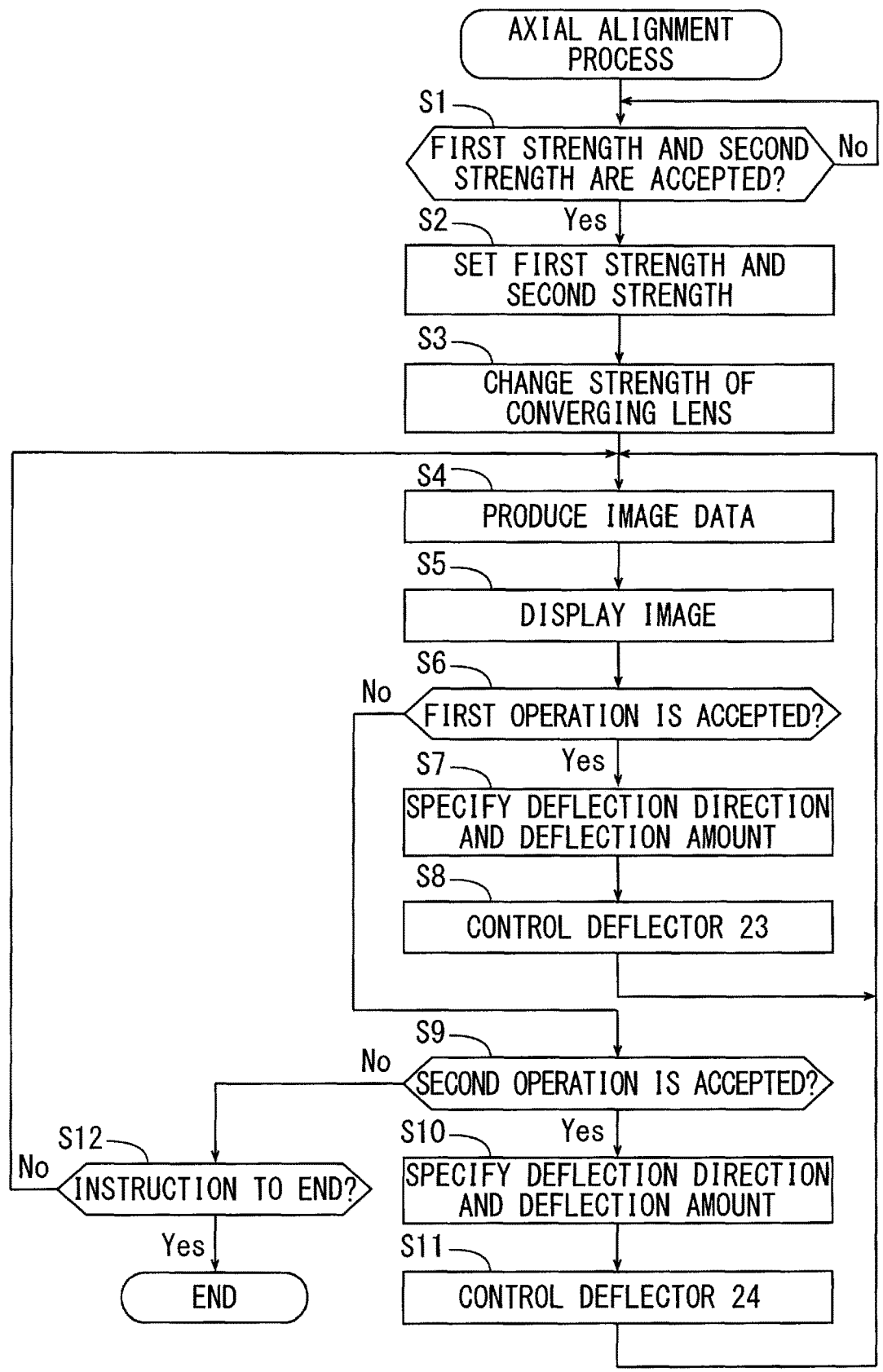
FIG. 4 is a flow chart showing the algorithm of an axial alignment process executed by an axial alignment program.
Figure 5A:
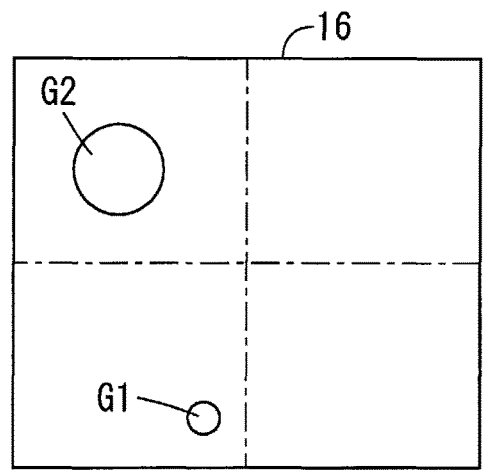
FIGS. 5A to 5C are diagrams showing one example of a change of an image in the axial alignment process.
Figure 5B:
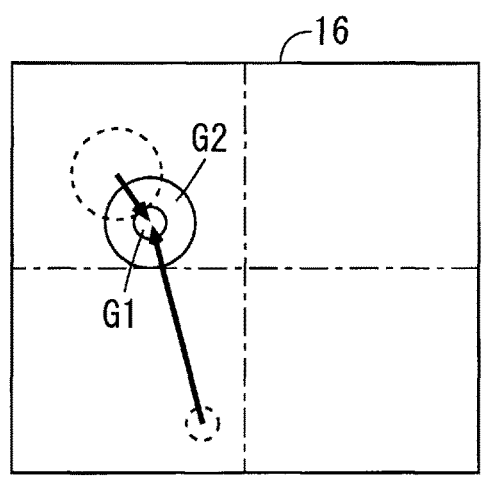
Figure 5C:
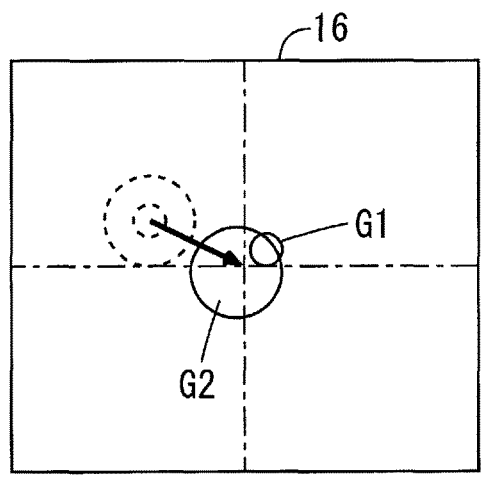

FIG. 4 is a flow chart showing the algorithm of the axial alignment process executed by the axial alignment program. FIGS. 5A to 5C are diagrams showing one example of the change of the image in the axial alignment process. During the axial alignment process, the current measurer 30 is provided on the axis Ax by the actuator (not shown). Suppose that the electron beam emitted from the charged particle source 21 has not passed through at least one of the centers of the condenser lenses 22A, 22B before execution of the axial alignment process.

First, the process acceptor A determines whether the first strength and the second strength are accepted as the strength of the converging lens 22 (step S1). When the first strength and the second strength are not accepted, the process acceptor A waits until the first strength and the second strength are accepted. When the first strength and the second strength are accepted, the strength changer B sets the first strength and the second strength (step S2). The strength changer B repeatedly and alternately changes the strength of the conversing lens 22 between the first strength and the second strength set in the step S2 (step S3).

The producer C produces the image data based on the current in each portion of the subject surface measured by the current measurer 30 (step S4). When the image data is produced, the electron beam is two-dimensionally scanned by the deflector 24 in the plane perpendicular to the optical axis of the deflector 24. The display controller D allows the display unit 16 to display the image based on the image data produced in the step S4 (step S5).

In this case, as shown in FIG. 5A, the aperture images G1, G2 respectively corresponding to the first strength and the second strength appear in the image displayed in the display unit 16. Because the electron beam has not passed through at least one of the centers of the condenser lenses 22A, 22B, the positions of the aperture images G1, G2 are different from each other. Further, the focal point in the case where the strength is the first strength is different from the focal point in the case where the strength is the second strength, so that the diameters of the aperture images G1, G2 are different from each other.

Next, the operation acceptor E determines whether the operation performed by the user using the operator 15a has been accepted as the first operation (step S6). When the first operation is accepted, the deflection controller G specifies the deflection direction and the deflection amount of the electron beam by the deflector 23 based on the accepted first operation (step S7). Thereafter, the deflection controller G controls the deflector 23 such that the electron beam is deflected in the deflection direction specified in the step S7 by the deflection amount specified in the step S7 (step S8), and returns to the step S4.

In this case, the steps S4 and S5 are performed again, so that the produced image data is updated, and the image displayed in the display unit 16 is updated. In the image, the positions irradiated with the electron beam on the subject surface of the current measurer 30 are moved, whereby the positions of the aperture images G1, G2 are moved. The user is to perform the first operation using the operator 15a while viewing the positions of the aperture images G1, G2 such that the centers of the aperture images G1, G2 overlap with each other as indicated by thick arrows in FIG. 5B.

When the first operation is not accepted in the step S6, the operation acceptor F determines whether the operation performed by the user using the operator 15b has been accepted as the second operation (step S9). When the second operation is accepted, the deflection controller H specifies the deflection direction and the deflection amount of the electron beam by the deflector 24 based on the accepted second operation (step S10). Thereafter, the deflection controller H controls the deflector 24 such that the electron beam is deflected in the deflection direction specified in the step S10 by the deflection amount specified in the step S10 (step S11), and returns to the step S4.

In this case, the steps S4 and S5 are performed again, so that the image displayed in the display unit 16 is updated. In the image, the positions irradiated with the electron beam on the subject surface of the current measurer 30 are moved, so that the positions of the aperture images G1, G2 are moved. The user performs the second operation using the operator 15b while viewing the positions of the aperture images G1, G2 such that the centers of the aperture images G1, G2 overlap with the center of the image as indicated by a thick arrow in FIG. 5C.

When the second operation is not accepted in the step S9, the process acceptor A determines whether the instruction to end the axial alignment process has been given (step S12). The user can give an instruction to end the axial alignment process by operating the operation unit 15. When the instruction to end the axial alignment process is not given, the process acceptor A returns to the step S4. On the other hand, when the instruction to end the axial alignment process is given, the process acceptor A ends the axial alignment process.

In the steps S9 to S11, the aperture images G1, G2 are preferably moved to the center of the image while overlapping with each other. However, when the deflector 24 is arranged in close proximity to the deflector 23, the deflection of the electron beam by the deflector 24 largely interferes with the adjustment of the deflector 23 in the steps S6 to S8. In this case, even when the electron beam is deflected by the deflector 24 in the steps S9 to S11, the aperture images G1, G2 are not moved while overlapping with each other. Therefore, a deviation between the positions of the aperture images G1, G2 is generated again as shown in FIG. 5C.

As such, the above-mentioned steps S4 to S11 are repeated such that the centers of the aperture images G1, G2 overlap with each other at the center of the image. The user can perform the first and second operations until the centers of the aperture images G1, G2 overlap with each other at the center of the image. After the centers of the aperture images G1, G2 overlap with each other at the center of the image, the user is to give the instruction to end the axial alignment process.

(4) Effects

In the charged particle beam irradiation device 100 according to the present embodiment, the magnetic field strength of the converging lens 22 is repeatedly and alternately changed between the first strength and the second strength by the strength changer B. The information corresponding to the position of the aperture image G1 in the case where the strength is the first strength and the information corresponding to the position of the aperture image G2 in the case where the strength is the second strength are produced by the producer C. The aperture images G1, G2 are displayed in the display unit 16 by the display controller D based on these information pieces as images.

The information is updated due to the movement of the aperture images G1, G2, and the images of the aperture images G1, G2 displayed in the display unit 16 are updated based on the updated information. In this case, the aperture images G1, G2 in the image displayed in the display unit 16 are moved according to the adjustment of the deflectors 23, 24. Therefore, the user can adjust the deflection direction and the deflection amount of the electron beam by the deflectors 23, 24 while viewing the aperture images G1, G2 in the image using the operators 15a, 15b.

During the repetitive changes of the magnetic field strength, the operation performed using the operator 15a is accepted by the operation acceptor E, and the deflector 23 is controlled to move the aperture images G1, G2 based on the accepted operation. Further, during the repetitive changes of the magnetic field strength, the operation performed using the operator 15b is accepted by the operation acceptor F, and the deflector 24 is controlled to move the aperture images G1, G2 based on the accepted operation.

With the above-mentioned configuration, the magnetic field strength of the converging lens 22 is repeatedly and alternately changed between the first strength and the second strength, so that it is not necessary for the user to change the strength each time and perform the operation for producing the information of the aperture images G1, G2. Therefore, the operational burden of the user is alleviated. Further, it is possible to easily and quickly switch the adjustment between the adjustment to be carried out by the deflector 23 and the adjustment to be carried out by the deflector 24 by properly operating the operator 15a and the operator 15b. Thus, the operability of the electron beam irradiation device 100 is improved. As a result, the axis of the electron beam can be aligned easily and in a short period of time.

In particular, in the present embodiment, the operators 15a, 15b are respectively the right press-down portion and the left press-down portion of the pointing device. Therefore, it is possible to more easily and more quickly switch the adjustment between the adjustment to be carried out by the deflector 23 and the adjustment to be carried out by the deflector 24 by properly using these press-down portions. Thus, the operability of the charged particle beam irradiation device 100 is more sufficiently improved. As a result, the axis of the electron beam can be aligned more easily.

Further, in the present embodiment, the current of the electron beam is measured using the current measurer 30. In this case, the axis of the electron beam can be aligned without irradiation of the sample S with the electron beam. Thus, the sample S can be prevented from being damaged by the electron beam. Further, differently from the case where the sample S is irradiated with the electron beam and the image data is produced, when the image data is produced using the current measurer 30, variations in brightness of the image depending on the sample are not generated. Therefore, it is possible to always align the axis under the same condition by determining the condition for brightness once as long as the same charged particle source 21 is used.

[2] Second Embodiment (1) Axial Alignment Device

Figure 6:
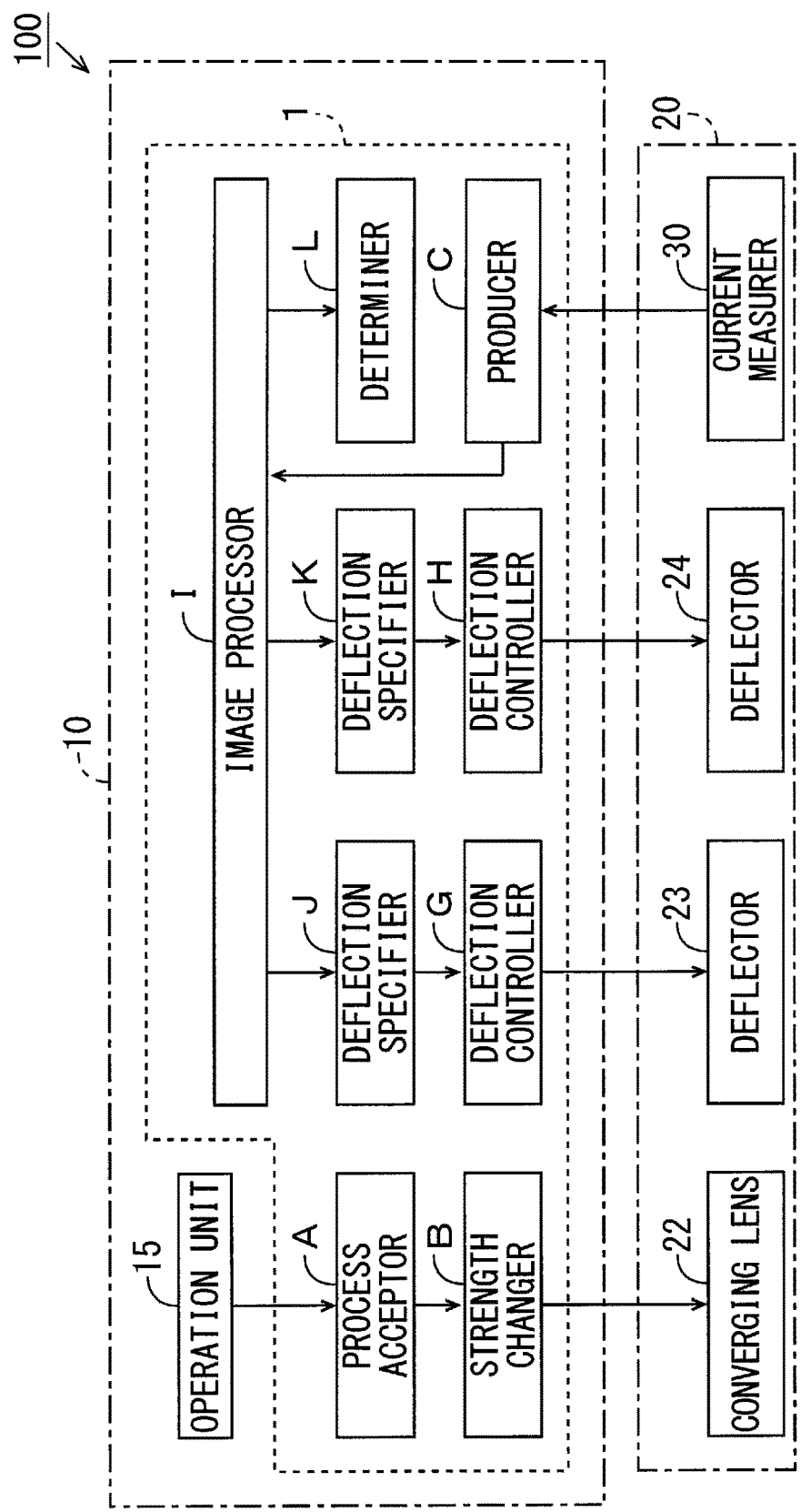
FIG. 6 is a diagram showing a configuration of the axial alignment device included in a charged particle beam irradiation device according to a second embodiment.

As for a charged particle irradiation device 100 according to a second embodiment, differences from the charged particle beam irradiation device 100 according to the first embodiment will be described. FIG. 6 is a diagram showing a configuration of an axial alignment device 1 included in the charged particle beam irradiation device 100 according to the second embodiment. As shown in FIG. 6, the axial alignment device 1 includes an image processor I, deflection specifiers J, K and a determiner L instead of the display controller D and the operation acceptors E, F of FIG. 3.

The CPU 11 of FIG. 1 executes the axial alignment program stored in the storage device 14, whereby the functions of the constituent elements (A to C, G to L) of the axial alignment device 1 of FIG. 6 are implemented. Part or all of the constituent elements (A to C, G to L) of the axial alignment device 1 of FIG. 6 may be implemented by hardware such as an electronic circuit.

The image processor I performs an image process on the image data produced by the producer C. The deflection specifier J specifies a deflection direction and a deflection amount of an electron beam by the deflector 23 based on the result of the image process by the image processor I. Further, the deflection specifier J supplies the specified deflection direction and the specified deflection amount to the deflection controller G as a movement instruction for an aperture image.

Based on the result of the image process by the image processor I, the deflection specifier K specifies the deflection direction and the deflection amount of the electron beam by the deflector 24 for allowing the center of gravity of one aperture image to overlap with the center of an image. Further, the deflection specifier K supplies the specified deflection direction and the specified deflection amount to the deflection controller H as a movement instruction for the aperture image. Based on the result of the image process by the image processor I, the determiner L determines whether the centers of gravity of the two aperture images overlap with each other at the center of the image. The center of gravity of the aperture image means the center of gravity calculated by values of a plurality of images corresponding to openings of the objective aperture plate 25 in the image data.

(2) Axial Alignment Process

Figure 7:
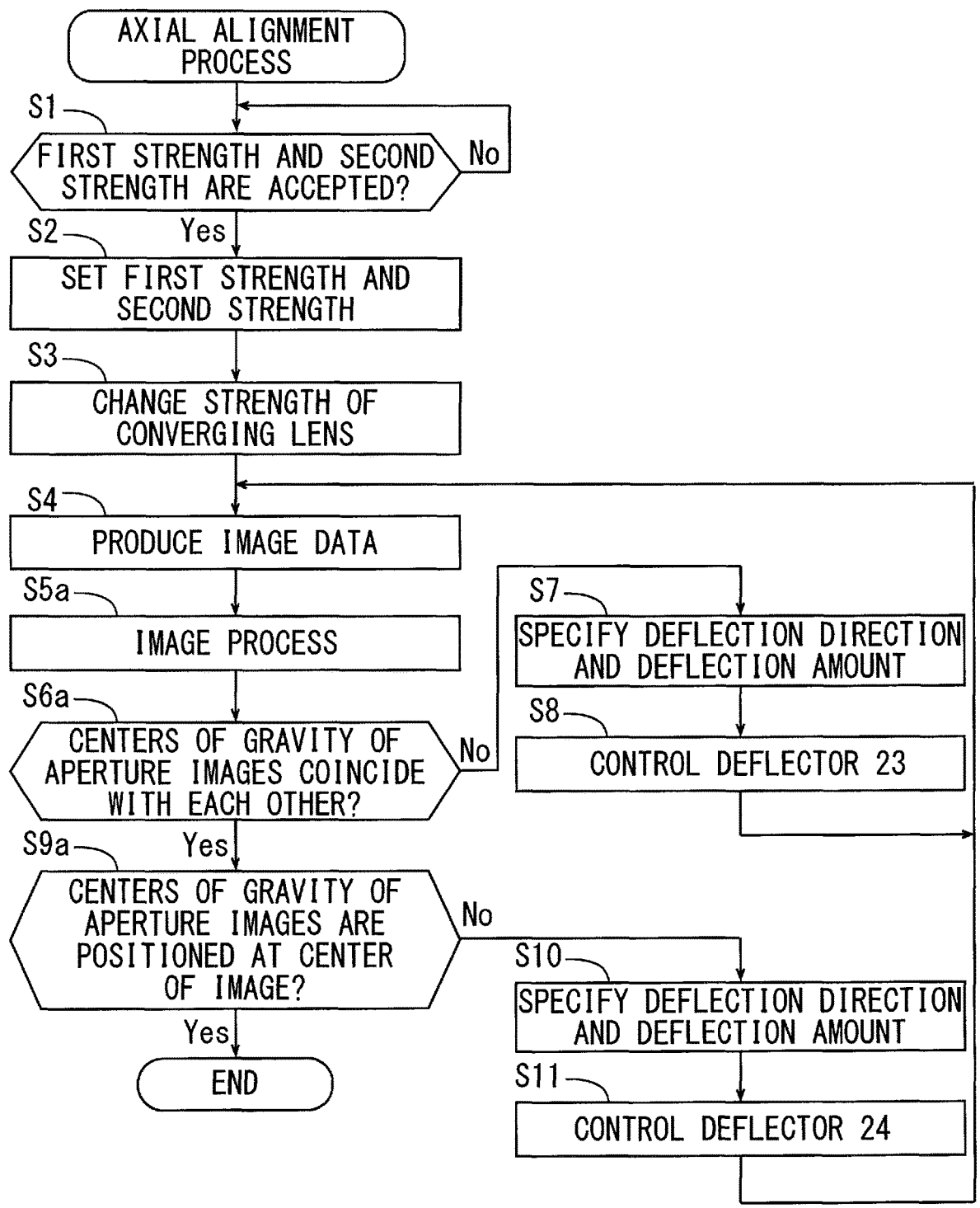
FIG. 7 is a flow chart showing the algorithm of an axial alignment process executed by an axial alignment program in a second embodiment.

FIG. 7 is a flow chart showing the algorithm of an axial alignment process executed by the axial alignment program in the second embodiment. The axial alignment process in the FIG. 7 is similar to the axial alignment process in FIG. 4 except that the steps S5a, S6a and S9a are included instead of the steps S5, S6 and S9, and that the step S12 is not included.

After the step S4, the image processor I performs the image process on the image data produced in the step S4 (step S5a). The determiner L determines whether the centers of gravity of the aperture images G1, G2 overlap with each other based on the result of the image process in the step S5a (step S6a).

When the centers of gravity of the aperture images G1, G2 do not overlap with each other, the deflection specifier J specifies the deflection direction and the deflection amount of the electron beam by the deflector 23 for allowing the centers of gravity of the aperture images G1, G2 to overlap with each other based on the result of the image process in the step S5a (step S7). The deflection controller G controls the deflector 23 such that the electron beam is deflected in the deflection direction specified in the step S7 by the deflection amount specified in the step S7 (step S8), and returns to the step S4. When the centers of gravity of the aperture images G1, G2 overlap with each other in the step S6a, the determiner L determines whether the centers gravity of the aperture images G1, G2 are positioned at the center of the image based on the result of the image process in the step S5a (step S9a).

When the centers of gravity of the aperture images G1, G2 are not positioned at the center of the image, the deflection specifier K specifies the deflection direction and the deflection amount of the electron beam by the deflector 24 for allowing the centers of gravity of the aperture images G1, G2 to overlap with the center of the image based on the result of the image process in the step S5a (step S10). The deflection controller H controls the deflector 24 such that the electron beam is deflected in the deflection direction specified in the step S10 by the deflection amount specified in the step S10 (step S11), and returns to the step S4. When the centers of gravity of the aperture images G1, G2 are positioned at the center of the image in the step S9a, the determiner L ends the axial alignment process.

Whether the centers of gravity of the aperture images G1, G2 overlap with each other (step S6a) and whether the centers of gravity of the aperture images G1, G2 are positioned at the center of the image may be simultaneously determined (step S9a), and the deflectors 23, 24 may be simultaneously controlled. In this case, the deflectors 23, 24 are controlled in consideration of the interference of the deflectors 23, 24 with each other, whereby the accuracy of adjustment in one convergence is improved.

(3) Effects

In the charged particle beam irradiation device 100 according to the present embodiment, the deflectors 23, 24 are automatically adjusted such that the aperture images G1, G2 overlap with each other at the center of the image. Therefore, it is not necessary for the user to perform the operation for adjusting the deflectors 23, 24. Thus, the axis of the electron beam can be easily aligned.

Further, the deflector 23 is adjusted such that not the centers of the aperture images G1, G2 but the centers of gravity of the aperture images G1, G2 overlap with each other. Further, the deflector 24 is adjusted such that not the centers of the aperture images G1, G2 but the centers of gravity of the aperture images G1, G2 overlap with each other. In this case, the axis of the electron beam can be more accurately aligned.

[3] Other Embodiments (1) While the charged particle beam is an electron beam in the above-mentioned embodiment, the present invention is not limited to this. The charged particle beam may be another charged particle beam such as an ion beam.

(2) While the charged particle beam irradiation device 100 includes one objective lens 27 in the above-mentioned embodiment, the present invention is not limited to this. The charged particle beam irradiation device 100 may include a plurality of objective lenses 27 that are arranged in multiple tiers. The axial alignment process can also be performed in such a charged particle beam irradiation device 100.

(3) While the axial alignment device 1 includes the current measurer 30 in the above-mentioned embodiment, the present invention is not limited to this. When the image data is produced based on the electrons detected by the detector 29, the axial alignment device 1 does not have to include the current measurer 30. In this case, the surface of a sample S is a subject surface. Further, the information corresponding to the position of the aperture image is included in the produced image data.

(4) While the operation unit 15 is a mouse and the operators 15a, 15b are respectively a right button and a left button of the mouse in the above-mentioned embodiment, the present invention is not limited to this. Each operator 15a, 15b may be another operator such as a cross key, an operation stick or an operation knob.

(5) While the deflector 24 is adjusted such that the aperture images G1, G2 overlap with the center of the image in the above-mentioned embodiment, the present invention is not limited to this. When the current measurer 30 is arranged such that a part other than the center of the image overlaps with the optical axis of the objective lens 27, the deflector 24 may be adjusted such that the aperture images G1, G2 overlap with the part other than the center of the image.

(6) While the deflector 23 is adjusted such that the centers of the aperture images G1, G2 overlap with each other in the first embodiment, the present invention is not limited to this. When the centers of gravity of the aperture images G1, G2 are shown in the image by the image process or the like, the deflector 23 may be adjusted such that the centers of gravity of the aperture images G1, G2 overlap with each other.

While the deflector 24 is adjusted similarly in the first embodiment such that the centers of the aperture images G1, G2 overlap with a predetermined portion in the image, the present invention is not limited to this. The deflector 24 may be adjusted such that the centers of gravity of the aperture images G1, G2 overlap with the predetermined portion in the image.

[4] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the deflectors 23, 24 are respectively examples of first and second deflectors, the current measurer 30 is an example of a subject surface, and the deflection controllers G, H are respectively examples of first and second deflection controllers. The operators 15a, 15b are respectively examples of first and second operators, and the condenser lenses 22A, 22B are respectively examples of first and second condenser lenses. In the first embodiment, the operation acceptors E, F are respectively examples of first and second movement instructors. In the second embodiment, the deflection specifiers J, K are respectively examples of first and second movement instructors.

I claim:

1. A charged particle beam axial alignment device that adjusts an axis of a charged particle beam in a charged particle beam irradiation device for irradiating a subject surface with a charged particle beam through a first deflector, a converging lens, a second deflector and an objective aperture plate, comprising:

a strength changer that repeatedly and alternately changes magnetic field strength of the converging lens between first strength and second strength;

a producer that produces first information corresponding to a position of a first aperture image indicating an opening of the objective aperture plate when the magnetic field strength is the first strength, and produces second information corresponding to a position of a second aperture image indicating the opening of the objective aperture plate when the magnetic field strength is the second strength;

a first movement instructor that gives a first movement instruction for the first and second aperture images during repetitive changes of the magnetic field strength based on the first information and the second information;

a first deflection controller that controls the first deflector to move the first and second aperture images based on the first movement instruction;

a second movement instructor that gives a second movement instruction for the first and second aperture images based on the first information and the second information during repetitive changes of the magnetic field strength; and a second deflection controller that controls the second deflector to move the first and second aperture images based on the second movement instruction.

2. The charged particle beam axial alignment device according to claim 1, further comprising a display controller that allows a display unit to display the first aperture image based on the first information as an image, and allows the display unit to display the second aperture image based on the second information as an image, wherein the first movement instructor accepts an operation for adjusting a deflection direction and a deflection amount of the charged particle beam by the first deflector from a first operator, and gives the first movement instruction based on the accepted operation, the second movement instructor accepts an operation for adjusting a deflection direction and a deflection amount of the charged particle beam by the second deflector from a second operator, and gives the second movement instruction based on the accepted operation, the producer updates the first information and the second information according to movement of the first and second aperture images, and the display controller updates images of the first and second aperture images displayed in the display unit based on the updated first information and the updated second information.

3. The charged particle beam axial alignment device according to claim 2, wherein one of the first and second operators is a first press-down portion of a pointing device, and another one of the first and second operators is a second press-down portion of the pointing device.

4. The charged particle beam axial alignment device according to claim 2, wherein the strength changer repeatedly changes the magnetic field strength between the first strength and the second strength in a period during which the first and second aperture images in the display unit are simultaneously viewed due to residual image effect.

5. The charged particle beam axial alignment device according to claim 1, wherein the first movement instructor specifies movement directions and movement distances of the first and second aperture images for allowing the first aperture image and the second aperture image to overlap with each other based on the first information and the second information, and gives the first movement instruction based on the specified movement directions and the specified movement distances, and the second movement instructor specifies movement directions and movement distances of the first and second aperture images for allowing the first and second aperture images to move to a predetermined position based on the first information and the second information, and gives the second movement instruction based on the specified movement directions and the specified movement distances.

6. The charged particle beam axial alignment device according to claim 5, wherein the first movement instructor specifies movement directions and movement distances for allowing centers of gravity of the first aperture image and the second aperture image to overlap with each other, and the second movement instructor specifies movement directions and movement distances of the first and second aperture images for allowing the centers of gravity of the first and second aperture images to move to the predetermined position.

7. The charged particle beam axial alignment device according to claim 5, wherein the predetermined position overlaps with an optical axis of the objective lens.

8. The charged particle beam axial alignment device according to claim 1, wherein the converging lens includes first and second condenser lenses, the first strength is determined as a combination of predetermined magnetic field strength of the first condenser lens and predetermined magnetic field strength of the second condenser lens, and the second strength is determined as a combination of another predetermined magnetic field strength of the first condenser lens and another predetermined magnetic field strength of the second condenser lens.

9. The charged particle beam axial alignment device according to claim 1, wherein the subject surface is provided at a faraday cup that can measure an electric current of the charged particle beam, and the producer produces the first information and the second information based on the electric current measured by the faraday cup.

10. The charged particle beam axial alignment device according to claim 9, wherein one of the first strength and the second strength is determined such that the electric current of the charged particle beam measured by the faraday cup is maximized.

11. The charged particle beam axial alignment device according to claim 9, wherein the faraday cup is configured to measure the electric current of the charged particle beam using a plurality of measurable ranges for the electric current, and the first strength and the second strength are determined such that the electric currents to be measured by the faraday cup are included in a same measurable range.

12. A charged particle beam irradiation device comprising:

a charged particle source that produces a charged particle beam;

a converging lens that converges the charged particle beam, which is produced by the charged particle source, by a magnetic field;

a first deflector that adjusts a positional relationship between an axis of the charged particle beam and an optical axis of the converging lens by deflecting the charged particle beam produced by the charged particle source;

an objective aperture plate that restricts an electric current of the charged particle beam converged by the converging lens;

a second deflector that adjusts a positional relationship of the charged particle beam on a subject surface by deflecting the charged particle beam converged by the converging lens; and a charged particle beam axial alignment device that adjusts the axis of the charged particle beam, wherein the charged particle beam axial alignment device includes a strength changer that alternately and repeatedly changes magnetic field strength of the converging lens between first strength and second strength, a producer that produces first information corresponding to a position of a first aperture image indicating an opening of the objective aperture plate when the magnetic field strength is the first strength, and produces second information corresponding to a position of a second aperture image indicating the opening of the objective aperture plate when the magnetic field strength is the second strength, a first movement instructor that gives a first movement instruction of the first and second aperture images based on the first information and the second information during repetitive changes between the first strength and the second strength by the strength changer, a first deflection controller that controls the first deflector to move the first and second aperture images based on the first movement instruction, a second movement instructor that gives a second movement instruction of the first and second aperture images based on the first information and the second information during repetitive changes between the first strength and the second strength by the strength changer, and a second deflection controller that controls the second deflector to move the first and second aperture images based on the second movement instruction.

13. A charged particle beam axial alignment method for adjusting an axis of a charged particle beam in a charged particle beam irradiation device that irradiates an subject surface with a charged particle beam through a first deflector, a converging lens, a second deflector and an objective aperture plate, comprising:

changing magnetic field strength of the converging lens between first strength and second strength;

producing first information corresponding to a position of a first aperture image indicating an opening of the objective aperture plate when the magnetic field strength is the first strength, and producing second information corresponding to a position of a second aperture image indicating the opening of the objective aperture plate when the magnetic field strength is the second strength;

giving a first movement instruction of the first and second aperture images based on the first information and the second information during repetitive changes of the magnetic field strength;

controlling the first deflector to move the first and second aperture images based on the first movement instruction;

giving a second movement instruction of the first and second aperture images based on the first information and the second information during repetitive changes of the magnetic field strength; and controlling the second deflector to move the first and second aperture images based on the second movement instruction.

* * * * *